United States Patent [19]

Verhaart

[11] Patent Number: 5,546,010
[45] Date of Patent: Aug. 13, 1996

[54] METHOD FOR MEASURING A RESISTANCE VALUE IN AN ELECTRICAL APPARATUS

[75] Inventor: Henricus F. A. Verhaart, Doorwerth, Netherlands

[73] Assignee: N.V. Kema, Arnhem, Netherlands

[21] Appl. No.: 379,338

[22] Filed: Jan. 27, 1995

[30] Foreign Application Priority Data

Feb. 11, 1994 [NL] Netherlands ............................ 9400221

[51] Int. Cl.$^6$ ..................................................... G01R 27/08
[52] U.S. Cl. ........................... 324/713; 324/547; 324/726; 340/646
[58] Field of Search ..................................... 324/421, 423, 324/546, 547, 654, 710, 713, 726, 545; 340/646, 644

[56] References Cited

U.S. PATENT DOCUMENTS 4,458,196  7/1984  Goyal et al. ............................ 324/649

FOREIGN PATENT DOCUMENTS 2502790  10/1982  France .
3213866  10/1983  Germany .

OTHER PUBLICATIONS

W. Widmann, "Switching Capacities of Diverter Switches for Transformers", Siemens Power Engineering & Automation, VII (1985) No. 1, pp. 35–39, month unavailable.

Primary Examiner—Kenneth A. Wieder
Assistant Examiner—Diep Do
Attorney, Agent, or Firm—Banner & Allegretti, Ltd.

[57] ABSTRACT

The invention relates to a method for measuring a resistance value in a network incorporated in an electrical apparatus, wherein the network has at least two accessible terminals, the network has at least two time constants differing mutually by at least one order of magnitude, and the resistance value can be related to the voltage applied to the terminal clips and the current flowing through the apparatus.

Such control switches are poorly accessible.

Direct measurement is time-consuming as a result of the large value of the time constants. These problems are diminished by applying a step-like change of the voltage to the terminal clips, measuring the current flowing through the terminal clips before the change has taken place and after the transient phenomenon related to the smallest time constant and caused by applying the change is damped, and calculating the first resistance value from the measured values of the current.

11 Claims, 3 Drawing Sheets

METHOD FOR MEASURING A RESISTANCE VALUE IN AN ELECTRICAL APPARATUS

FIELD OF THE INVENTION

The invention relates to a method for measuring a resistance value in a network incorporated in an electrical apparatus, wherein the network has at least two accessible terminals, the network has at least two time constants differing mutually by at least one order of magnitude, and the resistance value can be related to the voltage applied to the terminal clips and the current flowing through the apparatus.

Such a method is applicable for instance in measuring the contact resistance of control switches of transformers.

BACKGROUND OF THE INVENTION

As they age the contacts of such control switches display an increased contact resistance, which moreover depends on the position of the control switch. This increase is caused by the deposition of carbon on the contacts during decomposition of the oil present in the switch. When the contact resistance increases the contacts burn in, which can result in breaking of the metallic contact. The then occurring electric arcs lead to burning away of the contacts, and a malfunction is then a fact.

These control switches are generally arranged in the case of a transformer, so that, in order to gain access to such a control switch, the oil must be drained from the transformer case and the control switch removed from the case. This is an expensive operation which must preferably be performed only when it is really necessary to recondition the control switch or perform other operations on the control switch.

There thus exists a need for a method for measuring the contact resistance of such a control switch without having to gain physical access to the control switch.

Put another way, there exists a need for a method for measuring a resistance value in a network incorporated in such an electrical apparatus.

It is of course possible to measure the DC resistance of a control switch and, connected thereto in series, the ohmic resistance value of a winding using a Thomson bridge, or by making use of a four-point measurement.

The fact that the winding is connected in series to the resistance whose value has to be measured has the result herein that, as a consequence of the self-induction of the winding, long wait times are necessary before the current becomes stationary. In typical grid transformers these wait times lie in the order of magnitude of about ten minutes.

The measuring of the contact resistance of a control switch in all positions and all three phases of the transformer is thus an activity taking up a particularly large amount of time.

The above stated known method is otherwise only suitable for measuring the stationary resistance of a control switch in a particular position of this switch. However, there is also often a need for information concerning the resistance of the switch during switching. At the moment an additional measurement is necessary for this purpose.

A known method of measuring the resistance change during switching makes use of an oscilloscope. The high-voltage winding of a phase is herein connected to a direct voltage source and the associated low-voltage winding is connected to the oscilloscope. Herein is assumed a situation in which the control switch is accommodated in the high-voltage winding. A change in the resistance on the primary (high-voltage) side during switching will result in a voltage change on the secondary side, which is visible on an oscilloscope. The value of the diverse contact resistances in the control switch can with some calculation be derived from the thus obtained oscillograms. This always relates however to dynamic effects; this measurement does not provide a definite answer concerning stationary contact resistances.

Another method of drawing some conclusion about the resistance change during switching makes use of a measuring bridge to determine the transformer ratio of a transformer. Loss of balance of the measuring bridge, which is visible as a movement of the needle of the null indicator during switching of the control switch, indicates a change in the contact resistance. The magnitude of the deflection of the null indicator gives some qualitative indication concerning the contact resistance but does not automatically result in quantitative values for the contact resistance.

SUMMARY OF THE INVENTION

The object of the present invention is to provide such a measuring method wherein in a short time and with great accuracy information can be obtained relating to the transfer resistances in such a control switch with both stationary and moving contacts.

This object is achieved by imposing a step-like change in the voltage applied by a power supply to the electrical apparatus or by a step-like change in a known resistance connected in series to the electrical apparatus, measuring the values of the current flowing through the terminal clips before the change has taken place and after the transient phenomenon related to the smallest time constant and caused by applying the step-like change is damped, and calculating the first resistance value from the measured value of the current.

It will be apparent that the most important field of application is now furnished by the control switches of transformers; it is however equally conceivable for the invention to be applied in other electrical apparatus, which likewise have components which are difficult to access and of which it is wished to determine the resistance values or the impedance.

BRIEF DESCRIPTION OF THE DRAWINGS

The invention will subsequently be elucidated with reference to the annexed drawings, in which.

DETAILED DESCRIPTION OF PREFERRED EMBODIMENTS

Figure 1:
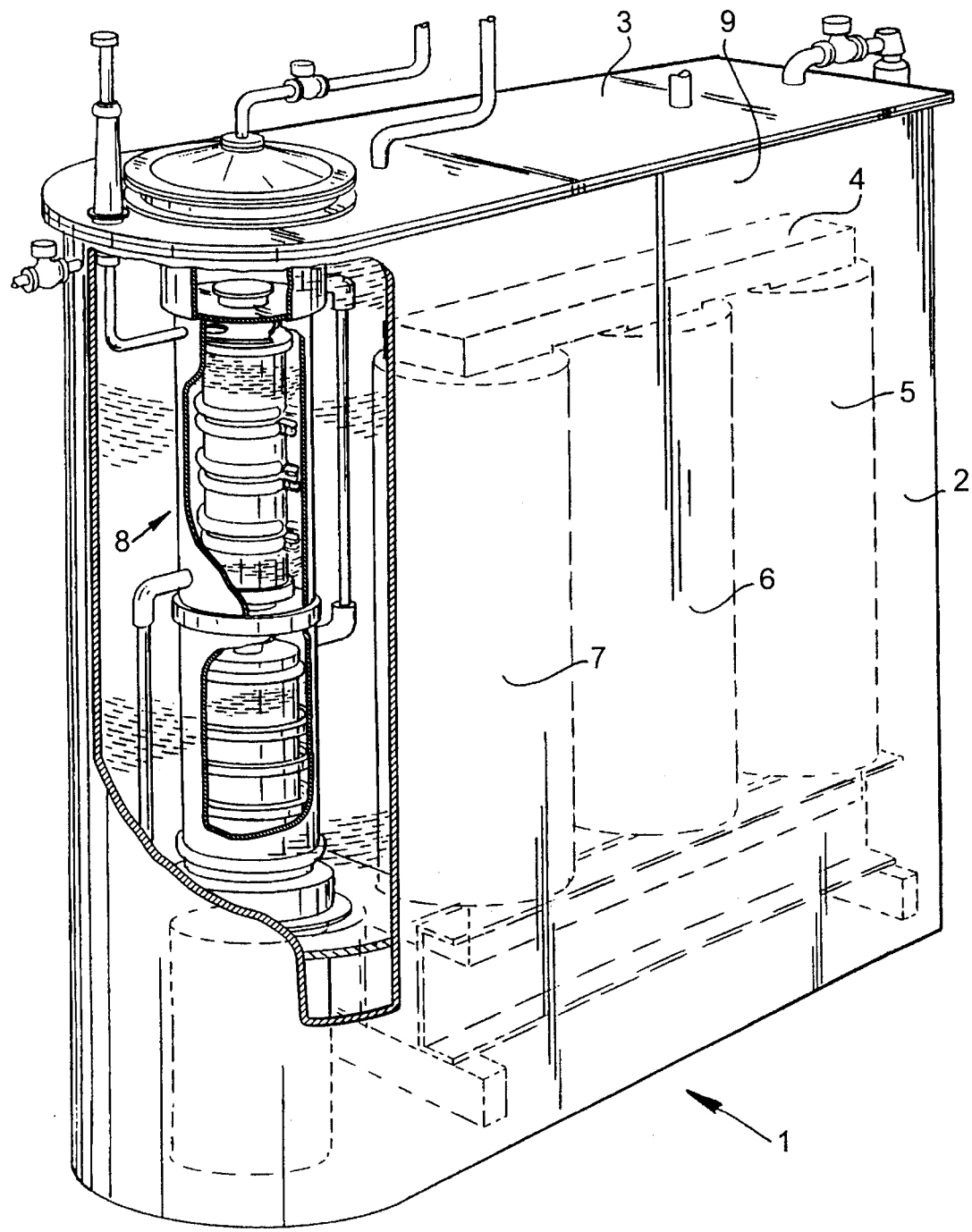
FIG. 1 shows a partly broken away perspective view of a grid transformer having therein a control switch to which the present invention can be applied.

Depicted in FIG. 1 is a transformer 1 which is formed by a case 2 which is closed on its upper side by a cover 3 and in which is arranged an iron circuit 4, on which is arranged for each phase a combination of a high and a low-voltage winding 5,6,7. Further accommodated in the case is a control switch 8, wherein a separate control switch is present for each of the three phases but wherein the separate control switches are moved in parallel. The construction of the control switches is not discussed further since this is not of importance to the present invention.

As can be seen in FIG. 1, the control switch 8 is arranged in the case 2, which is otherwise filled with insulating oil 9 so that access can only be gained to control switch 8 by draining the oil 9.

In accordance with the method according to the present invention use is made of the difference in time constants which prevail in a transformer and which are determined by the electrical resistances and inductions incorporated in the transformer. The values of the time constants do not otherwise have to be known.

Figure 2:
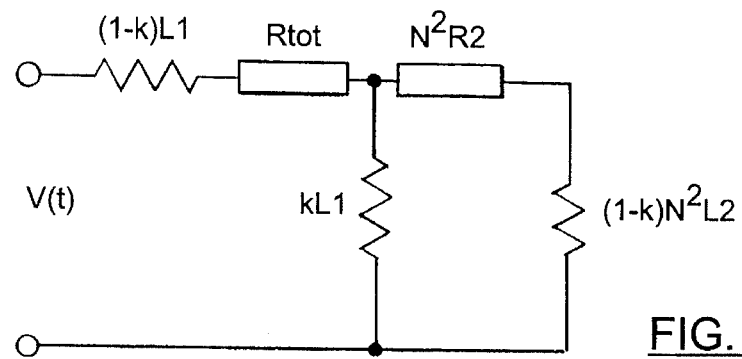
FIG. 2 shows an equivalent-circuit diagram of the circuit of a transformer belonging to one phase.

In order to explain the method use is made of an equivalent-circuit diagram for transformers as shown in FIG. 2 (the so-called equivalent T-circuit).

Herein N is the transformer ratio of the transformer and the coupling factor of the transformer is represented by k. The elements of the secondary side are reduced to elements on the primary side. The element $(1-k)L_1$ thus represents the primary leakage self-induction, $kL_1$ the total self-induction decreased by the leakage self-induction of the primary side, $R_{tot}$ the Ohmic resistance of the primary winding increased by the contact resistance of the control switch, and $(1-k)N^2L_2$ the leakage self-induction of the secondary side reduced to the primary side and $N^2R_2$ the resistance of the secondary side reduced to the primary side.

The above stated circuit has two time constants, viz.:

$$\tau_1 = \frac{2(1-k)L_1}{R_{tot} + N^2R_2} \qquad (1)$$

and $$\tau_2 = \frac{L_1(R_{tot} + N^2R_2)}{R_{tot}N^2R_2} \qquad (2)$$

If the transformer is short-circuited on the secondary side, the value of $R_2$ is then small and as the coupling factor of the grid transformer is practically equal to 1, then $\tau_1 \ll \tau_2$ applies in this situation. The above circuit thus has two time constants which differ mutually by at least one order of magnitude. Due to this great difference in value it is possible to clearly recognize in the response to a step-like change when the response with the smallest time constant is damped.

Figure 3:
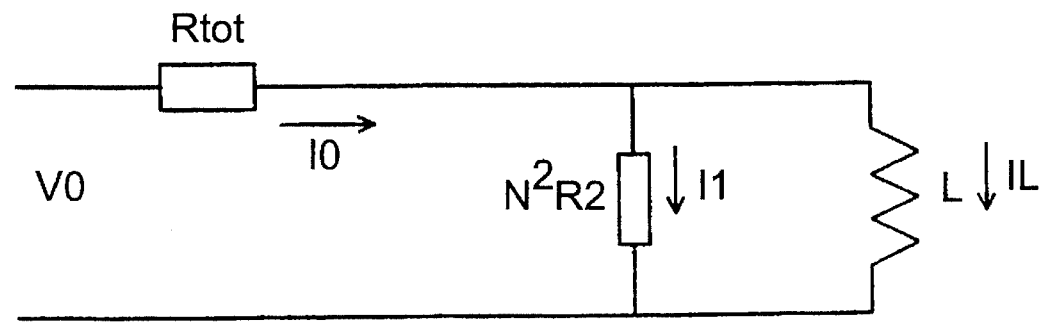
FIG. 3 shows a simplification of the equivalent-circuit diagram of FIG. 2 which applies after the response with the smallest time constant has taken place.

The equivalent-circuit diagram for the transformer after the response with the smallest time constant is damped is considerably simpler. The equivalent-circuit diagram is shown in FIG. 3.

It can be seen from the figure that if $V_0$ is a step function, for t=0 applies:

$$V_0 = I_0(0)R_{tot} + I_1(0)N^2R_2 = I_0(0)(R_{tot} + N^2R_2) \qquad (3)$$

$$I_L(0) = 0 \qquad (4)$$

$$R_{tot} = \frac{V_0}{I_0(0)} - N^2R_2 \qquad (5)$$

For $t \to \infty$ applies:

$$V_0 = R_{tot}I_0(\infty) \qquad (6)$$

$$I_0(\infty) = I_L(\infty) \qquad (7)$$

$$I_1(\infty) = 0 \qquad (8)$$

From which follows that:

$$R_{tot} = \frac{V_0}{I_0(\infty)} \qquad (9)$$

With equation 3 $R_2$ can then be calculated:

$$R_2 = \frac{1}{N^2}\left(\frac{V_0}{I_0(0)} - V_0I_0(\infty)\right) \qquad (10)$$

Both $R_{tot}$ and $R_2$ can thus be determined from the total step response. Once $R_2$ is known, $R_{tot}$ can then be determined in other positions or for other values of $V_0$ with equation 5 and it is no longer necessary to wait until the current has become constant.

Figure 4:
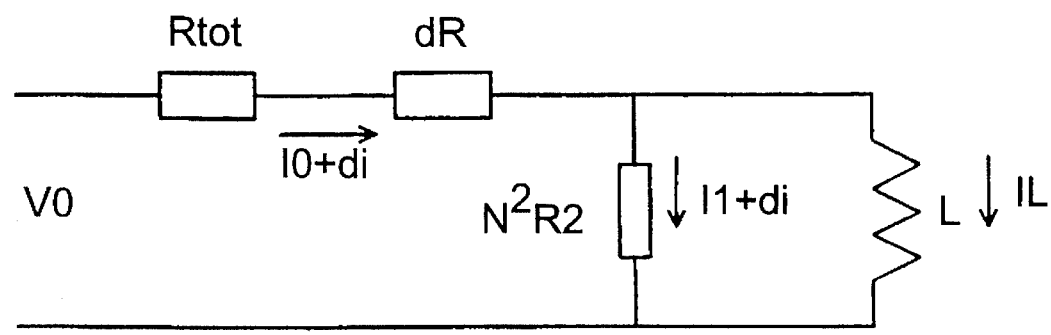
FIG. 4 shows the simplified equivalent-circuit diagram, wherein a resistance is added on the primary side.

Another possible transient is the addition of a resistance on the primary side at t=0. The equivalent-circuit diagram for this situation is shown in FIG. 4. It can be seen from this figure that for t=0 applies:

$$V_0 = I_0(t)R_{tot} + I_1(t)N^2R_2 \qquad (11)$$

$$I_0(t) = I_1(t) + I_L(t) \qquad (12)$$

From which follows that:

$$I_1(t) = \frac{V_0 - R_{tot}I_0(t)}{N^2R_2} \qquad (13)$$

For t=0 applies:

$$V_0 = (I_0 + di)(R_{tot} + dR) + (I_1 + di)N^2R_2 \qquad (14)$$

Where $I_0$ and $I_1$ are the values of $I_0(t)$ respectively $I_1(t)$ just before the resistance change and di is the change in current after the rapid response has taken place. Substituting equation 11 into equation 14 provides:

$$diR_{tot} + (I_0 + di)dR + diN^2R_2 = 0 \qquad (15)$$

If dR and $R_2$ are known, $R_{tot}$ can then be determined with:

$$R_{tot} = -\frac{dR(I_0 + di) + diN^2R_2}{di} \qquad (16)$$

If $R_{tot}$ and $R_2$ are known, dR can then be determined with:

$$dR = -\frac{di(R_{tot} + N^2R_2)}{I_0 + di} \qquad (17)$$

If the current is stationary at t=0 ($I_0(t)=I_L(t)=I_0$, $I_1(t)=0$) $R^2$ can then, with a known dR, be calculated with:

$$R_2 = -\frac{1}{N^2}\left(\frac{dR(I_0 + di)}{di} + \frac{V_0}{I_0}\right) \qquad (18)$$

If, before a change in resistance $dR_2$ takes place as a result of moving the contacts of the switch, switching takes place with a known resistance $dR_1$, there then applies:

$$dR_1 = \frac{di_1(R_{tot} + N^2R_2)}{I_{01} + di_1} \qquad (19)$$

$$dR_2 = \frac{di_2(R_{tot} + N^2R_2)}{I_{02} + di_2} \qquad (20)$$

Where $I_{01}$ and $I_{02}$ is the current just before switching with $dR_1$ respectively $dR_2$, while $di_1$ and $di_2$ is the change in the current after the rapid response following switching with $dR_1$ respectively $dR_2$. Combining equation 19 with equation 20 gives:

$$dR_2 = dR_1 \frac{di_2 (I_{01} + di_1)}{di_1 (I_{02} + di_2)} \qquad (21)$$

Two types of measurements can be distilled from the above theory. First, the response of the applied voltage to a step function and second, the response of the series resistance to a step-like change. With the first type of measurement the resistance can only be determined with stationary contacts, while with the second type of measurement the resistance of both stationary and moving contacts can be determined. The second type of measurement is thus the appropriate method of determining the contact resistances of a control switch.

Figure 5:
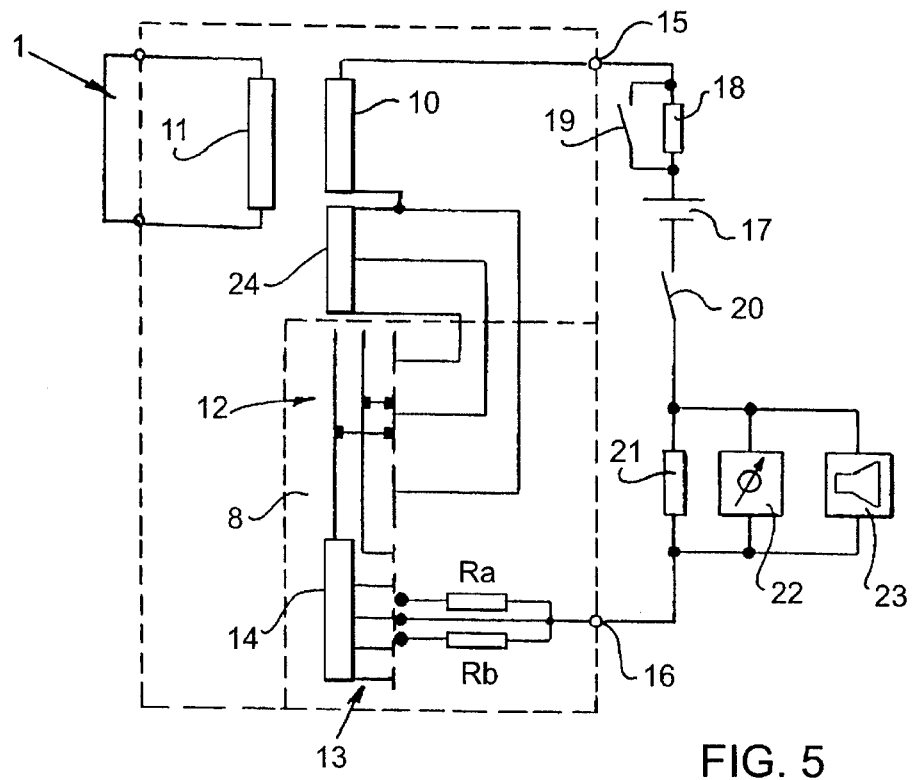
FIG. 5 shows a circuit diagram of a measuring circuit for use in the method according to the present invention.

In order to perform the measurement use is made of the measuring circuit as shown in FIG. 5. The circuit of a transformer 1 is shown herein for a single phase. The circuit of the transformer with control switch shown in FIG. 5 must be seen as an example, since in practice a number of circuits and diverse types of control switches are used. The transformer comprises a high-voltage winding 10 and an externally short-circuited, secondary winding 11. The control switch 8 is connected by means of three separate terminals to the coarse control windings of the primary side 24 and the control switch 8 comprises a coarse control switch 12 and fine control switch 13. The latter is in turn connected to a control winding 14 arranged round the iron core. The control switch is so designed that one contact of the coarse control switch does not carry any current at the transition to another position. The other contact does not switch during this movement but does move while it carries current.

Between the primary terminals 15,16 of the transformer is arranged a measuring circuit which is formed by a direct voltage source 17 to which a resistance 18 is connected in series which can be short-circuited by a switch 19. Further arranged in series is a main switch 20 and a measuring resistance 21. Connected across the measuring resistance is current measuring equipment, for instance in the form of a writing recorder 22 and an oscilloscope 23.

Figure 6:
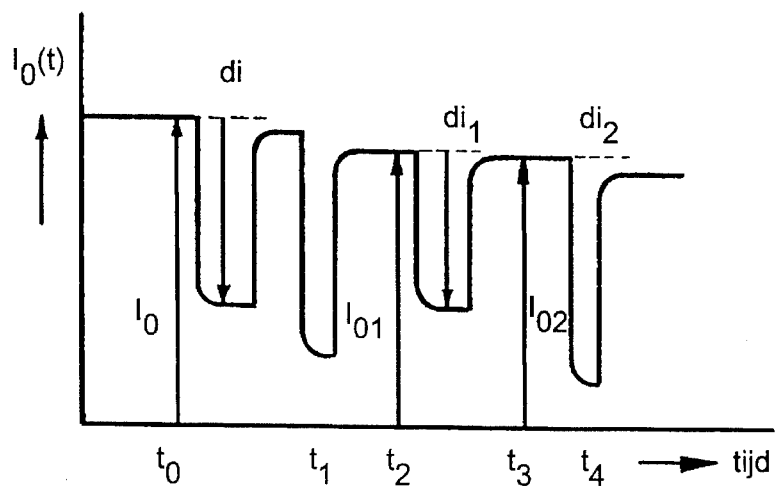
FIG. 6 shows a schematic view of an oscillogram to be obtained with the method according to the present invention.

The measuring procedure is as follows (the progress of the current during the measurement is shown schematically in FIG. 6). The control switch 12 is initially placed in an extreme position, wherein the coarse control switch and the fine control switch thus also lie in the extreme position. The measuring devices 22,23 are then switched on and switch 20 is closed, as is switch 19. There is then a wait until the current $I_0$ flowing through the measuring circuit becomes constant. The value of this current $I_0$ is measured. Switch 19 is then opened at $t_0$ for about 1 second. The value of the current di is then determined.

$R_{tot}$ and $R_2$ can be calculated from the stationary value $I_0$ and di with equations 9 and 18.

The fine control switch is subsequently placed a position further at $t_1$, which provides a change of current as a result of switching with resistances $R_a$ and $R_b$ of the fine control switch (see FIG. 5). Switch 19 is then opened once again for approximately one second at $t_2$. The value of $R_{tot}$ in this position of the control switch can then be determined with $I_{01}$ and $di_1$ using equation 16, wherein the other position of the control switch is taken into account.

This measurement is subsequently repeated for all other positions of the control switch. If, when the position of the control switch is changed, for instance to $t_3$, a movement of the coarse switch also takes place, a change in current $di_2$ can be detected as a result of a change in the contact resistance. With $I_{01}$, $I_{02}$, $di_1$ and $di_2$ the change in the contact resistance $dR_2$ can then be determined using equation 21.

The above stated measurement can then be repeated in the other two phases of the transformer.

Because in this measuring method the damping of transient phenomena with large time constant does not have to be taken into account in all positions, the measurement can be performed quickly. In addition, the contact resistance in both stationary contacts and moving contacts is determined in one measurement with this measuring method.

The calculations can of course be performed rapidly with a computer device programmed for that purpose.

The measuring method of the present invention can also be applied for measuring the ohmic resistance value of the windings of a transformer wherein the influence of the control switch is of less importance, for instance in temperature measurements of a transformer. Use is herein made of the fact that the resistance of a metal winding is temperature-dependent.

It was of course also possible to perform such a measurement with methods of the prior art, although in view of the long time constant the measurement had to extend over a long time duration, whereby direct recordings at varying temperatures were not possible.

This problem is obviated by the method according to the present invention. The method wherein the response to a step-like change in the applied voltage is measured is in any case the most suitable for this type of measurement.

While this invention has been described in conjunction with specific embodiments thereof, it is evident that many alternatives, modifications, and variations will be apparent to those skilled in the art. Accordingly, the preferred embodiments of the invention, as set forth herein, are intended to be illustrative, not limiting. Various changes may be made without departing from the true spirit and full scope of the invention, as defined in the following claims.

I claim:

1. A method for measuring a resistance value in a network incorporated in an electrical apparatus, said network having at least two accessible terminals, and at least two time constants differing mutually by at least one order of magnitude, said resistance value being related to a current flowing through terminal clips that are in electrical communication with said terminals, the method comprising the steps of:

applying a step-like voltage change to the terminal clips;

measuring the current flowing through the terminal clips before the voltage change has taken place and after a transient phenomenon related to the smallest of the at least two time constants and caused by applying the voltage change is damped; and calculating the resistance value from the measured values of the current.

2. The method of claim 1, wherein the electrical apparatus comprises a transformer.

3. The method of claim 2, wherein the transformer comprises a control switch having contacts, and the measurement determines a transfer resistance of the contacts of the controls switch.

4. The method of claim 2, wherein after each measurement, a control of the transformer is displaced by one position.

5. The method of claims 2, wherein the accessible terminals are formed by high-voltage terminals, and low-voltage terminals are short-circuited.

6. The method of claim 2, wherein the transformer is a polyphase transformer, and the measurement is performed phase by phase while remaining phases are not connected.

7. The method of claim 1, wherein a power supply is used to apply the voltage change, said power supply being a direct voltage supply.

8. A method for measuring a first resistance value in a network incorporated in an electrical apparatus, said network having at least two accessible terminals, and at least two time constants differing mutually by at least one order of magnitude, said first resistance value being related to it voltage applied to terminal clips that are in electrical communication with said terminals and a current flowing therethrough, the method comprising the steps of:

applying a step-like voltage change via a known resistance, said known resistance being connected in series to the electrical apparatus;

measuring values of the current flowing through the terminal clips before the voltage change has taken place and after a transient phenomenon related to the smallest of the at least two constants and caused by applying the voltage change is damped; and calculating the first resistance value from the measured values of the current.

9. The method of claim 8 further comprising measuring a second varying resistance value of the network, further comprising the steps of:

applying a step-like voltage change in a known resistance, said known resistance being connected in series to the electrical apparatus;

measuring values of the current flowing through the known resistance and the terminal clips before the voltage change of the known resistance has taken place and after the transient phenomenon related to the smallest time constants and caused by applying the voltage change is damped;

measuring values of the current flowing through the terminal clips before a change of a second resistance has taken place and after the transient phenomenon related to the smallest of the at least two time constants and caused by applying the voltage change is damped; and calculating the second resistance value from the measured values of the current.

10. The method of claim 9, wherein after performing the method according to claim 9 a change is made in a structure of the network by engaging at least one switch thereof and the method according to claim 3 is subsequently repeated.

11. The method of claim 9, wherein the second resistance value is a result of changing contact resistance of a control switch during a changing of position of the control switch.

* * * * *